(12) United States Patent
Yamashita et al.

(10) Patent No.: US 10,168,615 B2
(45) Date of Patent: Jan. 1, 2019

(54) IMPRINT APPARATUS, IMPRINT METHOD, AND ARTICLE MANUFACTURING METHOD

(71) Applicants: CANON KABUSHIKI KAISHA, Tokyo (JP); CANON NANOTECHNOLOGIES, INC., Austin, TX (US); KABUSHIKI KAISHA TOSHIBA, Tokyo (JP)

(72) Inventors: Keiji Yamashita, Utsunomiya (JP); Yutaka Watanabe, Shioya-gun (JP); Takuya Kono, Kanagawa-ken (JP); Masayuki Hatano, Kanagawa-ken (JP); Ikuo Yoneda, Mie-ken (JP)

(73) Assignees: CANON KABUSHIKI KAISHA, Tokyo (JP); CANON NANOTECHNOLOGIES, INC., Austin, TX (US); KABUSHIKI KAISHA TOSHIBA, Tokyo (JP)

( * ) Notice: Subject to any disclaimer, the term of this patent is extended or adjusted under 35 U.S.C. 154(b) by 489 days.

(21) Appl. No.: 14/309,960

(22) Filed: Jun. 20, 2014

(65) Prior Publication Data
US 2015/0014876 A1 Jan. 15, 2015

(30) Foreign Application Priority Data
Jul. 12, 2013 (JP) ................ 2013-146017

(51) Int. Cl.
*G03F 7/00* (2006.01)
*B29C 43/34* (2006.01)
(Continued)

(52) U.S. Cl.
CPC ............ *G03F 7/0002* (2013.01); *B29C 43/34* (2013.01); *B29C 31/045* (2013.01);
(Continued)

(58) Field of Classification Search
CPC .................................................... G03F 7/0002
See application file for complete search history.

(56) References Cited

U.S. PATENT DOCUMENTS

| 7,360,851 B1 | 4/2008 | Snyder |
| 2008/0018875 A1* | 1/2008 | Schram ................ G03F 7/0002 355/67 |
| 2013/0020281 A1 | 1/2013 | Wakamatsu et al. |

FOREIGN PATENT DOCUMENTS

| JP | 2011228619 A | 11/2011 |
| JP | 2013161893 A | 8/2013 |

OTHER PUBLICATIONS

JPO machine translation for JP 2011-228619, retrieved Aug. 19, 2017.*

(Continued)

*Primary Examiner* — Timothy Kennedy
(74) *Attorney, Agent, or Firm* — Rossi, Kimms & McDowell LLP (57) ABSTRACT

Provided is an imprint apparatus that applies a resin to several locations on a substrate, brings the resin and a mold into contact, and transfers a contoured pattern formed in the mold to the resin, comprising: a controller that sets a principal axis direction according to the contoured pattern and determines the application positions of the resin based on the principal axis direction that has been set such that the distances between resin drops that have been applied so as to be separated in the principal axis direction is larger than the distances between resin drops that have been applied so as to be separated in a direction that is perpendicular to the principal axis direction; and a dispenser that applies the resin based on the application position that has been determined.

12 Claims, 7 Drawing Sheets

(51) Int. Cl.
*B29C 43/58* (2006.01)
*B29C 31/04* (2006.01)
*B29C 43/02* (2006.01)

(52) U.S. Cl.
CPC ............... *B29C 2043/025* (2013.01); *B29C 2043/3438* (2013.01); *B29C 2043/5875* (2013.01)

(56) References Cited

OTHER PUBLICATIONS

Office Action issued in Japanese Patent Application No. 2013-146017 dated May 23, 2017. English translation provided.

* cited by examiner

IMPRINT APPARATUS, IMPRINT METHOD, AND ARTICLE MANUFACTURING METHOD

BACKGROUND OF THE INVENTION

Field of the Invention

The present invention relates to an imprint apparatus, an imprint method, and an article manufacturing method.

Description of the Related Art

The demand for micronization of semiconductor devices, magnetic recording media, and MEMS and the like is increasing, and in addition to the conventional photolithography technology, a microfabrication technology in which an uncured resin on a substrate is molded by using a mold and a resin pattern is formed on the substrate is gaining attention. This technology is called "imprint technology", and a fine structure on the order of several nanometers can be formed on a substrate. One example of an imprint technology is a photo-curing method. In an imprint apparatus that uses this photo-curing method, first, an ultraviolet light-cured resin (imprint material, photo-cured resin) is applied to a shot, which is an imprint area on a substrate (wafer). Next, this resin (photo-cured resin) is molded by using a mold. In addition, by separating the resin after curing the resin by irradiating ultraviolet light, a resin pattern is formed on the substrate. In addition to this photo-curing method, there is also, for example, a heat-curing method in which, after molding a heat-cured resin on a substrate by using a mold, heat is applied, and the resin is separated after being cured to form a resin pattern.

In such an imprint apparatus, from the point of view of increasing the throughput, preferably, during the pressing of the mold and the resin on a substrate, the resin is quickly filled into a fine contoured pattern that is formed in the mold. At the same time, when using this imprint apparatus to manufacture, for example, a semiconductor device, the minimum line width of the circuit pattern is equal to or less than 100 nm, and in order to fill the resin reliably into the contoured pattern formed in a mold that satisfies this line width requirement, the resin must have a low viscosity. In this context, the imprint apparatus normally uses a step and repeat method, and repeats the pattern forming and the step movement for each shot on the substrate. At this time, because the resin has a low viscosity, applying in advance a resist (in this case, the resin) to all shots on the substrate as is done, for example, in an exposure apparatus, becomes difficult. Thus, in an imprint apparatus, generally the resin is applied (dropped) onto the shot using an inkjet method for each pattern to be formed on each shot, that is, each time the mold and resin are pressed together. However, with an inkjet method, when the resin that has been applied to the substrate and the mold are pressed together, bubbles easily become trapped in the uncured resin between the mold and the substrate. When the resin is cured with bubbles being retained as-is in this manner, there is a possibility that unfilled portions will occur in the resin pattern to be formed. Thus, as a countermeasure to suppress the occurrence of such unfilled portions, the specification of U.S. Pat. No. 7,360,851 discloses an imprint technology in which locations at which bubbles remain are specified by monitoring the spread of the resin during pressing with a camera, and the amount of drops of resin at this location is made large.

The imprint technology disclosed in U.S. Pat. No. 7,360,851 is one in which the application positions originally set are not changed, and the amount of drops of resin at locations at which bubbles are retained is made large. However, when the application position is not changed and the amount of resin is made large, there is a possibility that the evenness of the remaining film thickness after the imprint will be affected. That is, in the setting of the application positions, preferably the occurrence of unfilled portions should be suppressed beforehand.

SUMMARY OF THE INVENTION

The present invention provides an imprint apparatus that is advantageous for, for example, suppressing the occurrence of portions of the contoured pattern of the mold that are unfilled by resin and increasing the throughput.

According to an aspect of the present invention, an imprint apparatus that applies a resin to several locations on a substrate, brings the resin and a mold into contact, and transfers a contoured pattern formed in the mold to the resin, comprising: a controller that sets a principal axis direction according to the contoured pattern and determines the application positions of the resin based on the principal axis direction that has been set such that the distances between resin drops that have been applied so as to be separated in the principal axis direction is larger than the distances between resin drops that have been applied so as to be separated in a direction that is perpendicular to the principal axis direction; and a dispenser that applies the resin based on the application position that has been determined.

Further features of the present invention will become apparent from the following description of exemplary embodiments with reference to the attached drawings.

DESCRIPTION OF THE EMBODIMENTS

Hereinafter, preferred embodiments of the present invention will be described with reference to the drawings.

First Embodiment

Figure 1:
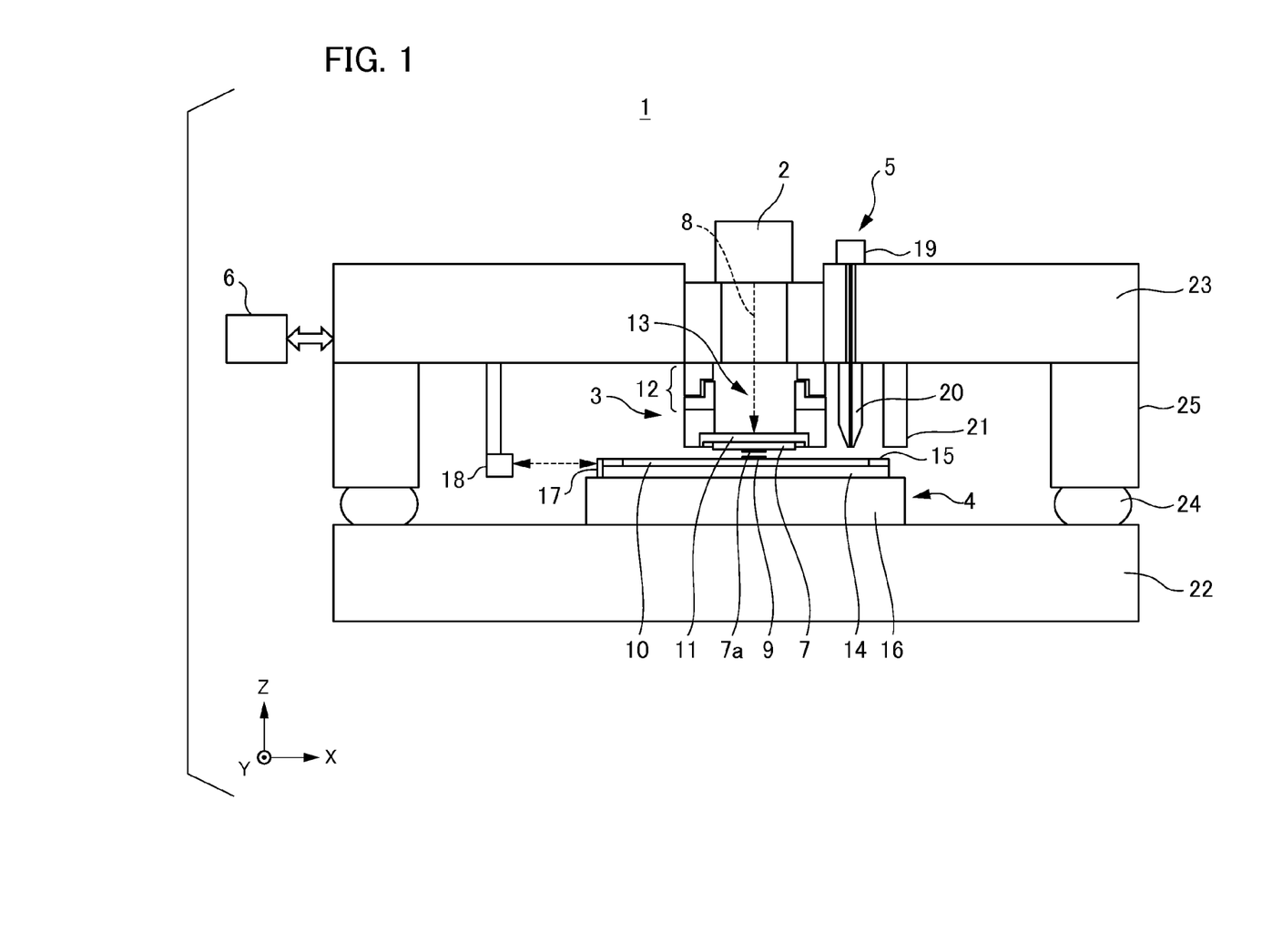
FIG. 1 is a drawing that shows the configuration of an imprint apparatus according to a first embodiment of the present invention.

First, an imprint apparatus according to a first embodiment of the present invention will be explained. FIG. 1 is a schematic view that shows the configuration of an imprint apparatus 1 according to the present embodiment. The imprint apparatus 1 is an apparatus that is used in the manufacture of devices such as semiconductor devices as an article, wherein molding is carried out by bringing into contact an uncured resin that has been applied to a wafer (substrate) and a mold, and a resin pattern is formed on a wafer. Note that in this case, this is assumed to be an imprint apparatus that uses a photo-curing method. In addition, in the attached drawings, the Z axis is parallel to the optical axis of the irradiation system that irradiates the resin on the wafer with ultraviolet light, and the X axis and Y axis are mutually perpendicular in a plane perpendicular to the Z axis. First, the imprint apparatus 1 is provided with a light irradiation unit 2, a mold holding mechanism 3, a wafer stage 4, a dispenser 5, and a controller 6.

The light irradiation unit 2 irradiates ultraviolet light 8 onto the mold 7 during the imprint treatment. This light irradiation unit 2 includes, although not illustrated, a light source and an illumination optical system that adjusts the ultraviolet light 8 that is emitted from this light source to light that is suitable for imprinting, and irradiates the mold 7. The light source can use lamps such as a mercury lamp, but this is not particularly limiting provided that the light can pass through the mold 7 and the light source emits light having a wavelength by which the resin (an ultraviolet light cured resin) 9, described below, is cured. The illumination optical system can include lenses, mirrors, apertures, or shutters for switching between irradiation and shielding. Note that in the present embodiment, although a light irradiation unit 2 is arranged in order to use a photo-curing method, in the case in which, for example, a heat curing method is used, a heat source for curing a heat-cured resin is arranged instead of this light irradiation unit 2.

The mold 7 has an outer peripheral shape that is polygonal (preferably, a rectangle or square), and includes a pattern unit 7a on which, for example, a contoured pattern that is to be transferred, such as a circuit pattern, is formed three-dimensionally at the surface opposed to the wafer 10. Note that there are various pattern sizes depending on the article that is the object of manufacture, but in fine articles, a pattern of tens of nanometers is also included. In addition, the material of the mold 7 preferably allows ultraviolet light 8 to pass and has a low thermal expansion rate, and can be, for example, fused silica. Furthermore, the mold 7 may include, on the surface that is irradiated by ultraviolet light 8, a cavity for which a flat part is a circle and having a certain depth.

Figure 2:
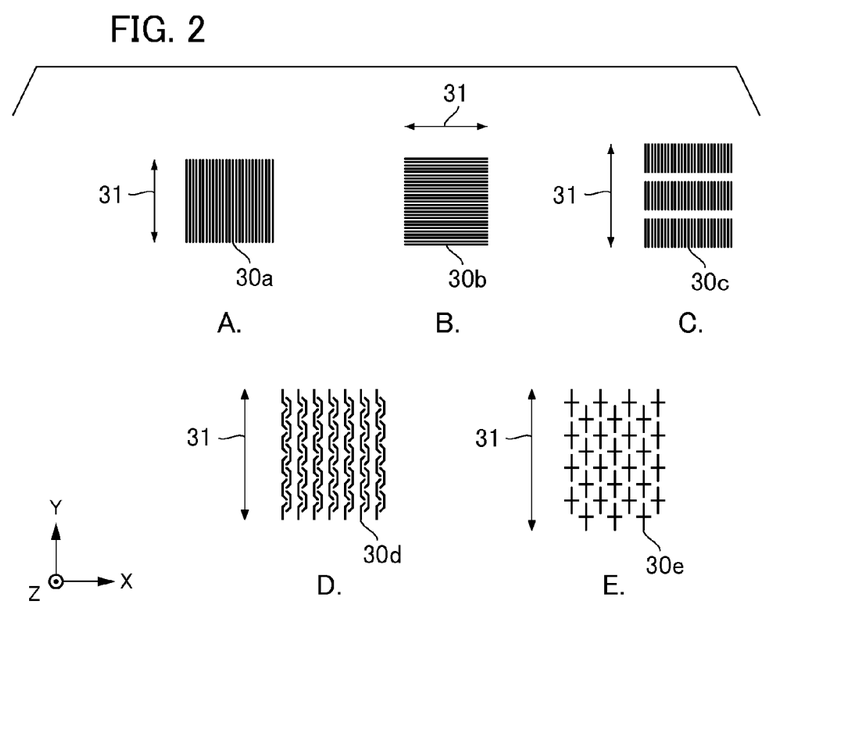
FIG. 2A to 2E are drawings that show an example of the form of a contoured pattern that is present in the pattern portion of a mold.

Here, as a reference, the form of a contoured pattern that can be formed by the pattern portion 7a will be explained. FIG. 2A to 2E are plan views that show examples of the forms of the contoured pattern 30. First, the contoured pattern 30a that is shown in FIG. 2A is one in which the principal axis direction is the Y axis direction. Here, the term "principal axis direction" denotes the direction in which fine recessed portions extend, and specifically, when the resin 9 is filled in the contoured pattern 30 that is formed in the pattern portion 7a, this is the direction in which the resin 9 readily flows. Next, the contoured pattern 30b that is shown in FIG. 2B is one for which the principal axis direction 31 is in the X axis direction. Next, the contoured pattern 30c that is shown in FIG. 2C is one for which the principal axis direction 31 is in the Y axis direction, and the fine recessed portions are divided at a plurality of locations. Next, the contoured pattern 30d that is shown in FIG. 2D is one for which the fine recessed portions include a plurality of curved portions in the direction of the plane. In this case, if the length of the recessed portions in the Y axis direction is long in comparison to the length in the X axis direction, the principal axis direction 31 of the contoured pattern 30d is in the Y axis direction. In addition, the contoured pattern 30e that is shown in FIG. 2E is one in which the fine recessed portions intersect in a cross form. In this case as well, if the length of the recessed portions in the Y axis direction is long in comparison to the length of the X axis direction, the principal axis direction 31 of the contoured pattern 30e is the Y axis direction.

The mold holding mechanism 3 includes a mold chuck 11 that holds the mold 7, a mold driving mechanism 12 that holds this mold chuck 11 so as to freely move, and, although not illustrated, a magnification correction mechanism that corrects the form of the mold 7 (pattern portion 7a). The mold chuck 11 can hold the mold 7 by attracting the outer peripheral area of the surface of the mold 7 that is irradiated by the ultraviolet light 8 by using a vacuum suction force or an electrostatic force. In the case in which the mold 7 is held, for example, by a vacuum suction force, the mold chuck 11 can adjust the suction force (holding power) applied to the mold 7 by being connected to a vacuum pump (not illustrated) that is arranged externally and suitably adjusting the suction pressure by the evacuation performed by this vacuum pump. The mold driving mechanism 12 moves the mold 7 in each axial direction so as to selectively carry out the pressing and separation between the mold 7 and the resin 9 on the wafer 10. For example, a linear motor and an air cylinder are drive sources that can be used in this mold drive mechanism. In addition, in order to accommodate the high precision positioning of the mold 7, the mold drive mechanism 12 may be configured by a plurality of drive systems, such as a coarse drive system and a fine drive system. Furthermore, the mold drive mechanism 12 can also be configured to include a position adjustment function for not only the Z axis direction, but also the X axis direction and the Y axis direction or the θ (rotation around the Z axis) direction, and a tilt function for correcting the tilt of the mold 7. Note that although the pressing and separating operations in the imprint apparatus 1 may also be realized by moving the mold 7 in the Z axis direction, this may also be realized by moving the wafer stage 4 in the Z axis direction or moving both relative to each other. In addition, although not illustrated, the position of the mold 7 during driving by the mold driving mechanism 12 can be measured by a position measuring unit such as an optical displacement gauge that measures the distance between the mold 7 and the wafer 10. The magnification correction mechanism is arranged in the mold chuck 11 on the holding side of the mold 7, and the form of the mold 7 (the pattern portion 7a) is corrected by mechanically applying an external force or a displacement to the side surface of the mold 7. Furthermore, the mold chuck 11 and the mold driving mechanism 12 include at the center portion (inside) of a plane direction an open area 13 through which the ultraviolet light 8 that has been irradiated from the light irradiation unit 2 can pass toward the wafer 10.

The wafer 10 is, for example, a single crystal silicon substrate, an SOI (Silicon on Insulator) substrate, or a glass substrate. A pattern (a layer including a pattern) of a resin 9 is molded by a pattern portion 7a in a plurality of pattern formation areas on the wafer 10 (before being conveyed into the imprint apparatus 1, a pattern (below, referred to as the "substrate-side pattern") has already been formed by a previous process).

The wafer stage 4 holds a wafer 10 so as to be movable, and, for example, carries out the alignment of the pattern portion 7a and the substrate-side pattern when the mold 7 and the resin 9 on the wafer 10 are pressed together and the like. The wafer stage 4 includes a wafer chuck 14 that holds a wafer 10 by a suction force, an auxiliary member 15 that is arranged so as to enclose the outer periphery of the wafer 10, and a stage drive mechanism 16 that mechanically holds the wafer chuck 14 and can move in each of the axial directions. The wafer chuck 14, for example, supports the wafer 10 by a plurality of pins having the same height and holds the wafer 10 by decreasing the pressure at the portion outside the pins by evacuation. The auxiliary member 15 has a surface height equal to that of the wafer 10 that has been mounted on the wafer chuck 14, and this is used in order to make uniform the thickness of the resin pattern at the outer peripheral end portion of the wafer 10. The stage drive mechanism 16 is a drive source having little vibration during driving or while stationary, and, for example, a linear motor or a plane motor and the like are drive sources that can be used. This stage drive mechanism 16 can also be configured with respect to each of the X axis and the Y axis directions by a plurality of drive systems such as a coarse drive system and a fine drive system. Furthermore, the stage drive mechanism 16 may be configured to include a drive system for position adjustment in the Z axis direction, a position adjustment function for position adjustment in a θ direction of the wafer 10, and a tilt function for correcting the tilt of the wafer 10. At the same time, the wafer stage 4 is provided with a plurality of reference mirrors 17 corresponding to each of the X, Y, Z, ωx, ωy, and ωz directions on the side surface thereof. In contrast, the imprint apparatus 1 is provided with a plurality of laser interferometers (position measurement devices) 18 that measure the position of the wafer stage 4 by irradiating beams such as helium neon onto these reference mirrors 17. Note that in FIG. 1, only one set of a reference mirror 17 and a laser interferometer 18 are illustrated. The laser interferometers 18 measure the position of the wafer stage 4 in real time, and a controller 6, described below, implements the positioning control of the wafer 10 (wafer stage 4) based on the measured values at this time. Note that in addition to the interferometer for measuring range described above, an encoder and the like that uses a semiconductor laser can be used as position measurement devices.

The dispenser 5 is arranged in proximity to the mold holding mechanism 3, and resin (uncured resin) 9 is applied to a shot (substrate-side pattern), which is a pattern forming area present on the wafer 10. This resin 9 is ultraviolet light-cured resin (photo-cured resin, imprint material) having a property of being cured by being exposed to ultraviolet light 8, and is suitably selected depending on various conditions such as the semiconductor device manufacturing steps and the like. This dispenser 5 uses an inkjet method as an application method, and includes a vessel 19 that contains the resin 9 in an uncured state and a drop ejecting unit 20. The vessel 19 preferably enables management of the resin 9 while the interior thereof has air that includes, for example, a small amount of oxygen so that a curing reaction of the resin 9 does not occur. In addition, the material of the vessel 19 preferably does not allow mixing of particles or chemical impurities into the resin 9. The drop ejecting unit 20 includes, for example, a piezo-type ejecting mechanism (inkjet head) that includes a plurality of ejection openings. The applied amount (ejection amount) of the resin 9 can be adjusted in a range of 0.1 to 10 pL/drop, and normally, about 2 pL/drop is used. Note that the total applied amount of the resin 9 is determined by the density of the pattern portion 7a and the desired remaining film thickness. The dispenser 5 applies by dispersion the resin 9 on the shot as drops (drops 32 explained below) and controls the application position and application amount and the like based on operation commands from the controller 6.

The controller 6 can control the operation and adjustment and the like of each of the components of the imprint apparatus 1. The controller 6 is configured, for example, by a computer and the like, is connected via circuits to each component of the imprint apparatus 1, and can execute the control of each of the components according to a program and the like. The controller 6 of the present embodiment at least controls the operation of the dispenser 5 and the wafer stage 4. Note that the controller 6 may be configured integrally (housed inside a shared case) with the other portions of the imprint apparatus 1, or may be configured as a separate unit (housed in a separate case) separately from the other portions of the imprint apparatus 1.

In addition, the imprint apparatus 1 is provided with an alignment measuring system 21 that measures alignment marks that are formed on the wafer 10. In addition, the imprint apparatus 1 is provided with a platen 22 on which the wafer stage 4 is mounted and that forms a reference plane, a bridge platen 23 that attaches the mold holding mechanism 3, and a support column 25 that extends from the platen 22 and supports the bridge platen 23 via a vibration isolator 24 that eliminates vibrations from the floor. Furthermore, although not illustrated, the imprint apparatus 1 can include a mold conveying mechanism that conveys a mold 7 between the outside of the apparatus and the mold holding mechanism 3 and a substrate conveying mechanism that conveys a wafer 10 between the outside of the apparatus and the wafer stage 4.

Next, the imprint method (imprint processing) by the imprint apparatus 1 will be explained. First, the controller 6 mounts and attaches the wafer 10 to the wafer stage 4 by using a substrate conveying apparatus. Next, the controller 6 sequentially measures alignment marks on the wafer 10 by using an alignment measuring system 21 while suitably changing the position of the wafer 10 by driving the stage drive mechanism 16, and detects the position of the wafer 10 with high precision. In addition, the controller 6 calculates each of the transfer coordinates based on the results of this detection, and forms patterns one by one for each predetermined shot based on the results of these calculations (step and repeat). As a flow of pattern formation on one certain shot, the controller 6 first positions the application position (a specific position on the shot) on the wafer 10 below the ejection opening of the drop ejection unit 20 by using the stage drive mechanism 16. Subsequently, the dispenser 5 applies a resin 9 to the shot on the wafer 10 (the application step). Next, the controller 6 moves and positions the wafer 10 such that the shot is positioned at the pressing position directly under the pattern portion 7a by using the stage drive mechanism 16. Next, after implementing the position alignment of the patterning unit 7a and the substrate-side pattern on the shot and the magnification correction of the patterning unit 7a by the magnification correction mechanism, the controller 6 drives the mold drive mechanism 12 and presses the pattern portion 7a onto the resin 9 on the shot (mold pressing step). Due to this pressing, the resin 9 fills the contoured pattern of the pattern portion 7a. Note that the controller 6 carries out the determination of the pressing completion by using a load sensor (not illustrated) that is arranged in the interior of the mold holding mechanism 3. In this state, the light irradiating unit 2 irradiates ultraviolet light 8 for a predetermined time from the back surface (upper surface) of the mold 7, which serves as a curing step, and the resin 9 is cured by the ultraviolet light 8 that has passed through the mold 7. In addition, after the resin 9 has been cured, the controller 6 drives the mold drive mechanism 12 again, and separates the pattern portion 7a from the wafer 10 (mold separation step). Thereby, on the surface of the shot of the wafer 10, a three-dimensional resin pattern (layer) is formed that conforms to the contoured pattern of the pattern portion 7a. The imprint apparatus 1 can form a plurality of resin patterns on one wafer 10 by executing such a series of imprint operations a plurality of times while changing the shot by driving the wafer stage 4.

Figure 3:
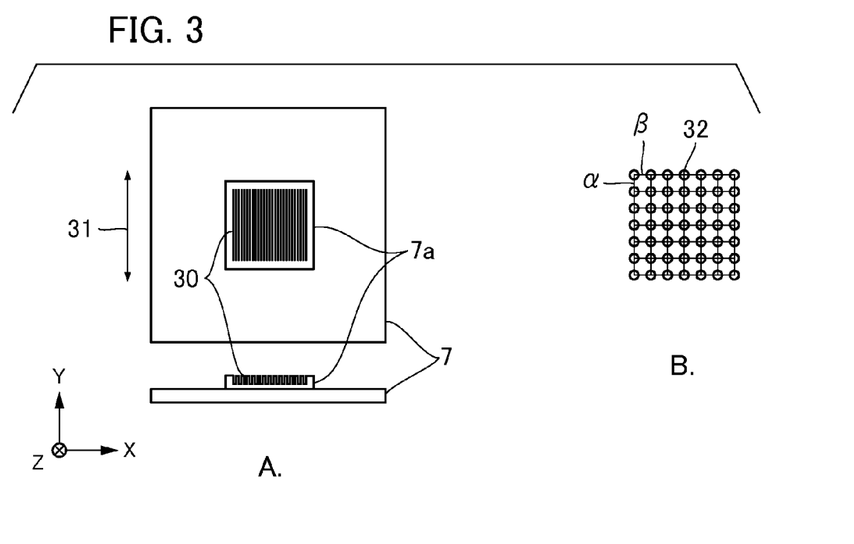
FIGS. 3A and 3B are drawings that show the form of a contoured pattern and a conventional disposition of drops.

Here, in the application step, the dispenser 5 implements the application of the resin 9 on the shot by ejecting a plurality of drops of the resin 9 as described above. Below, the disposition of the drops in the present embodiment on the shots at this time will be explained. First, for comparison, the case of a conventional imprint apparatus will be explained. FIG. 3 is a schematic plan view that shows the form of a contoured pattern 30 that has been formed by the pattern portion 7a of the mold 7 and the conventional disposition of drops of resin 9 that are applied to a shot on this contoured pattern 30. Note that, as shown in FIG. 3A, the form of the contoured pattern 30 in this case is identical to the form of the contoured pattern 30a that is illustrated in FIG. 2A. In a conventional imprint apparatus, as shown in FIG. 3B, the disposition of drops 32 on a shot is a square lattice form. Specifically, where $\alpha$ denotes the gap (distance between resin drops) between the drops 32 in the principal axis direction (Y axis direction) 31 and $\beta$ denotes the gap between drops 32 in a direction that is perpendicular to the principal axis direction 31 (X axis direction), as a disposition condition for the drops 32, each of the gaps has a relationship $\alpha=\beta$.

Figure 4:
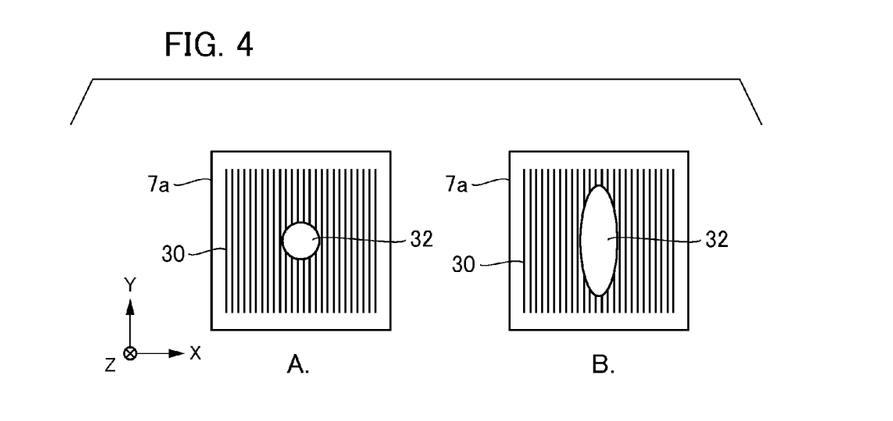
FIGS. 4A and 4B are drawings that show the filling behavior of one certain drop during pressing.

FIG. 4A and FIG. 4B are plan views that show the filling behavior of a one certain drop 32 with respect to the contoured pattern 30 when the pattern portion 7a and the resin 9 that has been applied to a shot are pressed together. As shown in FIG. 4A, when the pattern portion 7a comes into contact with the drop 32 on the shot, the drop 32 gradually spreads as shown in FIG. 4B. At this time, the drop 32 readily spreads along the principal axis direction 31 with little resistance, and in a direction that is perpendicular to the principal axis direction 31, the drop 32 does not readily spread because the drop must pass over the convex portions. Therefore, this drop 32 fills into the contoured pattern 30 while the spreading form of the drop 32 forms an elliptical that is long in the principal axis direction 31 and that is short in the direction perpendicular thereto.

Figure 5:
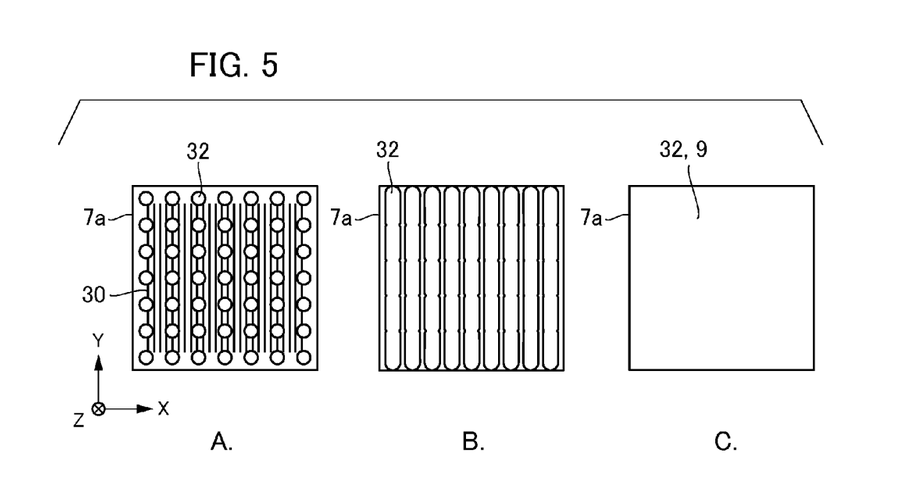
FIG. 5A to 5C are drawings that show the conventional filling behavior of drops that are disposed over the entire shot.

With reference to the filling behavior that is shown in FIG. 4A and FIG. 4B, FIG. 5A and FIG. 5B are schematic plan views for explaining the filling behavior of the drops 32 on the contoured pattern 30 when the drops 32 are disposed over the entire shot with gaps as shown in FIG. 3B. As shown in FIG. 5A, when the pattern portion 7a is brought into contact with the drops 32 on the shot, as shown in FIG. 5B, first the drops 32 come into contact with adjacent drops in the principal axis direction 31, and are merged into one row in this direction. Subsequently, each of the drops 32 (resin 9) are also brought into contact with adjacent drops (drop row) in the direction that is perpendicular to the principal axis direction 31, and as shown in FIG. 5C, finally the drops spread over the entire surface of the contoured pattern 30. Specifically, in a conventional imprint apparatus, when the patterning unit 7a and the resin 9 on the shot are pressed together, the time during which the drops spread in the direction perpendicular to the principal axis direction 31 is longer than the time during which the drops 32 spread in the principal axis direction 31. This spreading time becoming longer is related to the pressing time itself becoming long, and as a result, the throughput, that is, the productivity, is influenced. Note that in FIG. 3A to FIG. 5C, the width of the recessed portions of the contoured pattern 30 is shown enlarged to facilitate explanation. As explained above, the pattern size (groove width) of the contoured pattern 30 is extremely fine. Generally, the pattern size is 100 nm or less, whereas in contrast, the application gap between drops 32 is from tens to hundreds of μm, and the application gaps of the drops 32 are larger than the pattern side.

Figure 6:
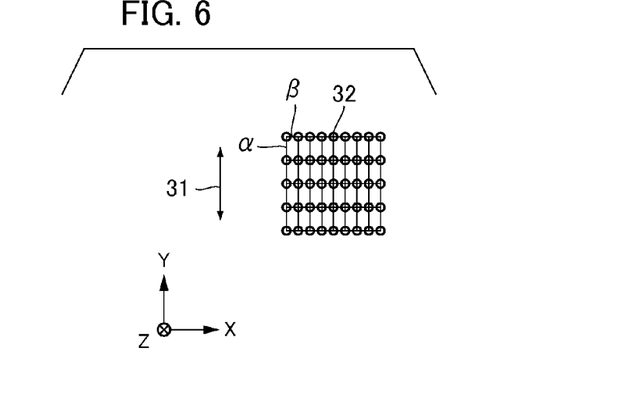
FIG. 6 is a drawing that shows the disposition of drops in the first embodiment.

In contrast, in the present embodiment, the spreading time of the drops 32 during pressing between the pattern portion 7a and the resin 9 on the shot is shortened by changing the disposition of the drops of the resin 9 applied to the shot from the conventional disposition that is shown in FIG. 3B. FIG. 6 is a schematic plan view that shows the disposition of the drops 32 of the resin 9 that are applied to the shot in the present embodiment. For comparison with the conventional case, note that the form of the contoured pattern 30 is identical to the form that is shown in FIG. 3A. In the conventional imprint apparatus, the disposition of the drops 32 on the shot is a square lattice form, whereas in contrast, the gaps between each of the drops 32 in the present embodiment are longer in the principal axis direction 31 than the conventional case, and the gaps in a direction that is perpendicular to the principal axis direction 31 are set to a short rectangular lattice form. Specifically, in this case as well, where $\alpha$ denotes the gaps between the drops 32 in the principal axis direction 31 and $\beta$ denotes the gaps between the drops 32 in a direction that is perpendicular to the principal axis direction 31, each of the gaps has the relationship $\alpha>\beta$ as a disposition condition for the drops 32 of the present embodiment.

Figure 7:
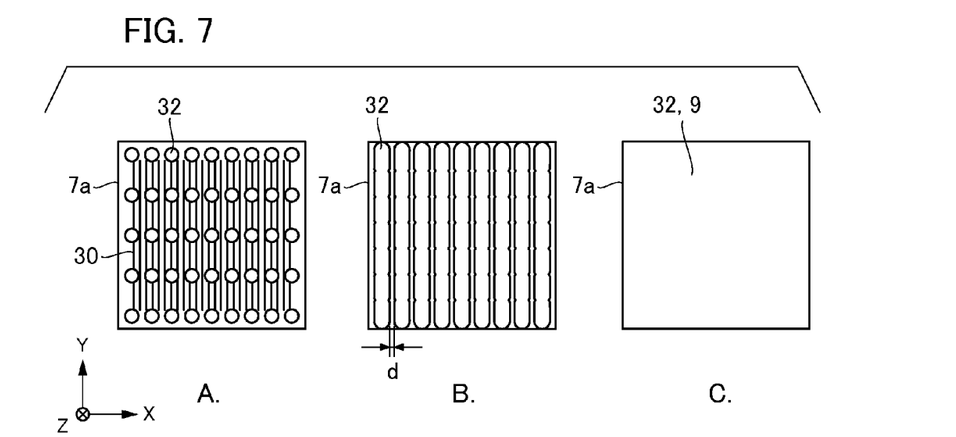
FIG. 7A to 7C are drawings that show the filling behavior of drops in the first embodiment.

FIG. 7A to FIG. 7C are schematic plan views for explaining the filling behavior of the drops 32 in the contoured pattern 30 when the disposition of the drops 32 on a shot is set as shown in FIG. 6 and each of the drops 32 is distributed over the entire shot. As shown in FIG. 7A, when the pattern portion 7a is brought into contact with the drops 32 on a shot, in this case as well, as shown in FIG. 7B, first the drops are brought into contact with adjacent drops in the principal axis direction 31, and are merged into one row in this direction. At this time, when viewed along the principal axis direction 31, as shown in FIG. 4B, the drops 32 spread in a short time along the recessed portions, and thus, even though the gap $\alpha$ is longer than a conventional one, the influence on the spreading time is small. In contrast, when viewed along the direction that is perpendicular to the principal axis direction 31, although the drops 32 must pass over the convex portions in order to spread, because the gap $\beta$ is smaller than the conventional one, the spreading time is short (refer to the gap d in FIG. 7B). After each of the drops 32 has spread in this manner in a short time, the adjacent drops (liquid rows) come into contact in a direction that is perpendicular to the principal axis direction 31, and finally, the drops 32 spread over the entire surface of the contoured pattern 30, as shown in FIG. 7C.

In the application step in the present embodiment, in addition to the application amount that is applied to the shot, the setting of the principal axis direction 31 as described above and the disposition of the drops 32 following this principal axis direction 31 are set in advance, and the resin 9 is applied by the dispenser 5 based on these sets of information. Here, in particular, the setting of the principal direction 31 may be carried out in advance by a controller 6 obtaining pattern data for a resin pattern that is to be formed on a shot and determining the setting based on this pattern data, or the setting of the principal direction may be input in advance by a user to the controller 6 as an initial setting. In addition, preferably the controller 6 measures in advance the spreading rate of the drops 32 during contact in each direction and determines the application position including specific values of the disposition of the drops 32 on the shot, that is, the application gaps (gaps α and β) based on this spreading rate. In this case, the ratio of the gaps β of the adjacent drops 32 in a direction perpendicular to the principal axis direction 31 to the gaps α of the drops that are adjacent in the principal axis direction 31 can be a reciprocal of the ratio of the spreading rate in a direction that is perpendicular to the principal axis direction 31 to the spreading rate in the principal axis direction 31.

In this manner, the imprint apparatus 1 can shorten the spreading time of the drops 32 in particular in the direction that is perpendicular to the principal axis direction 31 when the pattern portion 7a and the resin 9 on the shot are pressed together, and thus, as a result the throughput can be hastened and the productivity can be increased. In addition, in the present embodiment, not only setting the gap β so as to be short, but setting the gap α so as to be long is so that the total amount of the resin 9 that is applied to the shot does not differ from that of a conventional case. Specifically, the gap β being made short results the application positions of the drops 32 increasing in the direction that is perpendicular to the principal axis direction 31 to more than a conventional number. In contrast, if the application positions of the drops 32 on the principal axis direction 31 are decreased to less than the conventional number by lengthening the gap α, then the total amount of the resin 9 that is applied to the shot can be easily adjusted so as to be identical to the conventional amount. In particular, in the present embodiment, simply by changing the application gaps of the drops 32, the total applied amount of resin 9 that is applied to a shot is not different from the conventional amount, and is constant. That is, the evenness of the remaining film thickness of the resin pattern of the drops 32 that is formed on the wafer 10 (shot) can be directly realized, and the occurrence of portions of the contoured pattern 30 that are unfilled by resin 9 during pressing can be suppressed.

As explained above, according to the present embodiment, an advantageous imprint apparatus and method can be provided that can suppress the occurrence of portions of the contoured pattern of the mold that are unfilled by resin and increase the throughput.

Second Embodiment

Figure 8:
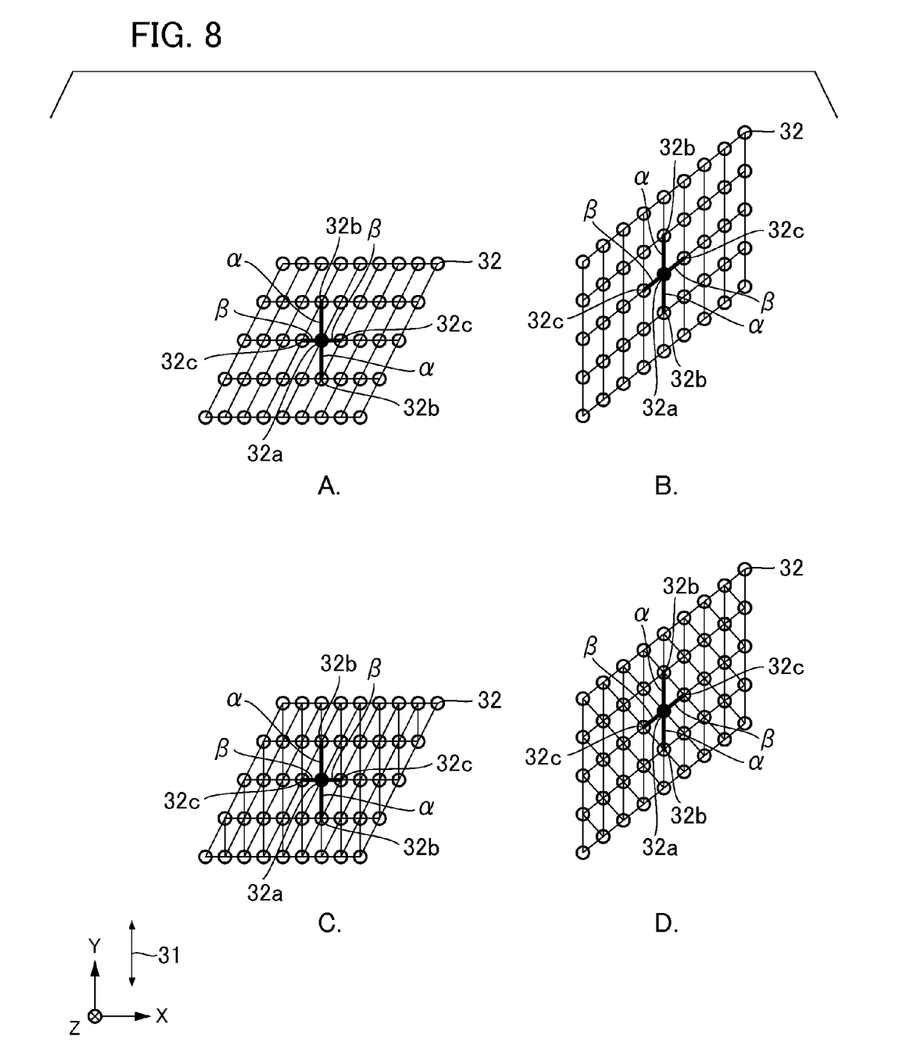
FIG. 8A to 8D are drawings that show the disposition of drops in a second embodiment.

Next, an imprint apparatus according to a second embodiment of the present invention will be explained. The feature of the imprint apparatus of the present embodiment is the point that the disposition of the drops 32 of the resin 9 that are applied to a shot on the wafer 10 is changed from a rectangular lattice of the case of the first embodiment to a polygon lattice form (a parallelogram lattice form or a triangular lattice form). FIG. 8A to FIG. 8D are schematic plan views that show the disposition of drops 32 in the present embodiment. Note that in the present embodiment as well, the form of the contoured pattern 30 is identical to the contoured pattern 30a that is illustrated in FIG. 2A, and the principal axis direction 31 is the Y axis direction. In particular, the dispositions of drops 32 that are shown in FIG. 8A and FIG. 8B are each a parallelogram lattice form. In contrast, the dispositions of the drops 32 that are shown in FIG. 8C and FIG. 8D are each a triangular lattice form. Among these, the dispositions that are shown in FIG. 8A and FIG. 8C are tilted in the X axis direction with respect to the direction that is perpendicular to the principal axis direction 31, whereas in contrast, the dispositions shown in FIG. 8B and FIG. 8D are tilted in the Y axis direction with respect to the principal axis direction 31. Here, α denotes the gap between an arbitrary drop 32a and a drop 32b that is disposed separated from drop 32a along the principal axis direction 31, and β denotes the gap between an arbitrary drop 32a and a drop 32c that is disposed separated from drop 32a along the direction that is perpendicular to the principal axis direction 31. In this case as well, the disposition of the drops 32 has the relationship α>β, which is identical to the first embodiment. Specifically, if each of the gaps satisfies the condition that α>β, the disposition of the drops 32 is not limited to the rectangular lattice profile that is shown in the first embodiment, but whether the disposition is a parallelogram lattice form or a triangular lattice form, the imprint apparatus 1 exhibits the same effect as that of the first embodiment.

Third Embodiment

Figure 9:
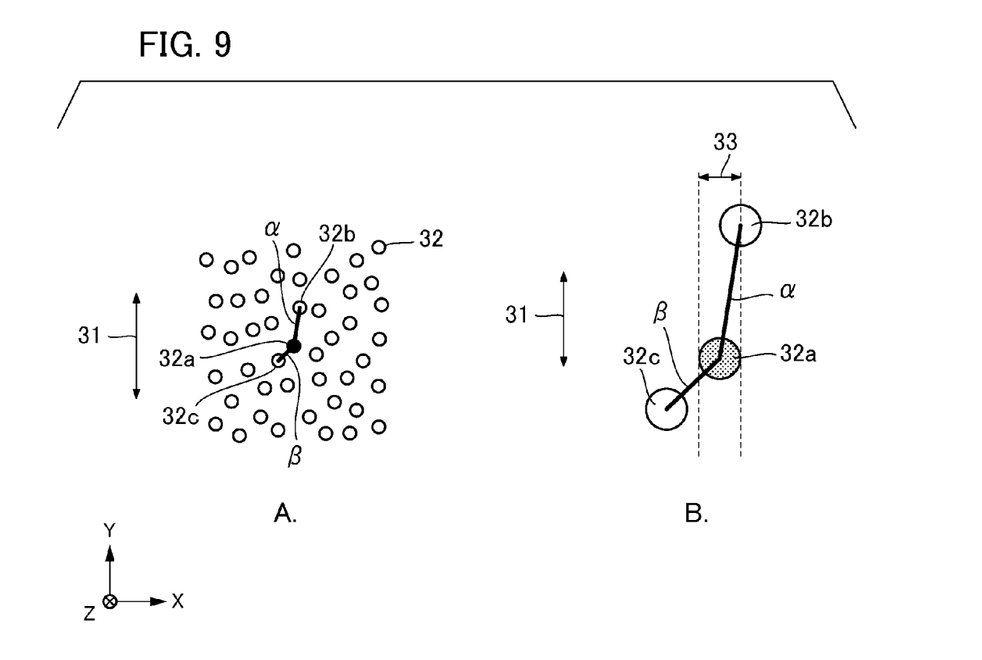
FIGS. 9A and 9B are drawings that show the disposition of drops in a third embodiment.

Next, an imprint apparatus according to a third embodiment of the present invention will be explained. The feature of the imprint apparatus of the present embodiment is the point that the disposition of drops 32 of the resin 9 that is applied to the shots on the wafer 10 is changed from the rectangular lattice form of the case of the first embodiment to a non-sequential form. FIG. 9A and FIG. 9B are schematic plan views that show the disposition of the drops 32 in the present embodiment. Note that in the present embodiment as well, the form of the contoured pattern 30 is identical to the contoured pattern 30a that is illustrated in FIG. 2A, and the principal axis direction is the Y axis direction. In particular, FIG. 9A is a drawing that shows each of the drops 32 that are disposed in a non-sequential form on a shot. In addition, FIG. 9B is a drawing that shows the disposition of a drop 32b that is adjacent to an arbitrary drop 32a at a position that is closest in a direction that is close to the principal axis direction 31 and a drop 32c that is adjacent to the arbitrary drop 32a that is closest in a direction that is close to the direction that is perpendicular to the principal axis direction 31. Here, the controller 6 sets in advance the disposition of each of the drops 32, that is, the positional relationship between the drop 32b and the drop 32c with respect to the drop 32a using, for example, the following method. First, as shown in FIG. 9B, the controller 6 assumes the presence of a band 33 having a width that is identical to the radius of an arbitrary drop 32a along the principal axis direction 31. Next, the controller 6 determines that a drop that overlaps this band 33 and that is present closest to the drop 32a is a drop 32b. In contrast, the controller 6 determines that a drop that does not overlap the band 33 and that is present closest to the drop 32a is a drop 32c. In addition, the controller 6 determines the disposition of each of the drops 32 so as to satisfy the relationship α>β, where α denotes the gap between an arbitrary drop 32a and a drop 32b and β denotes the gap between an arbitrary gap 32a and a drop 32c that is disposed separated from the arbitrary drop 32a along a direction that is perpendicular to the principal axis direction 31. In this manner, according to the present embodiment, the disposition of drops 32 is not a lattice array, as shown in the above embodiments, and by satisfying the above specific condition, the present embodiment exhibits an effect that is identical to that of the first embodiment.

Fourth Embodiment

Figure 10:
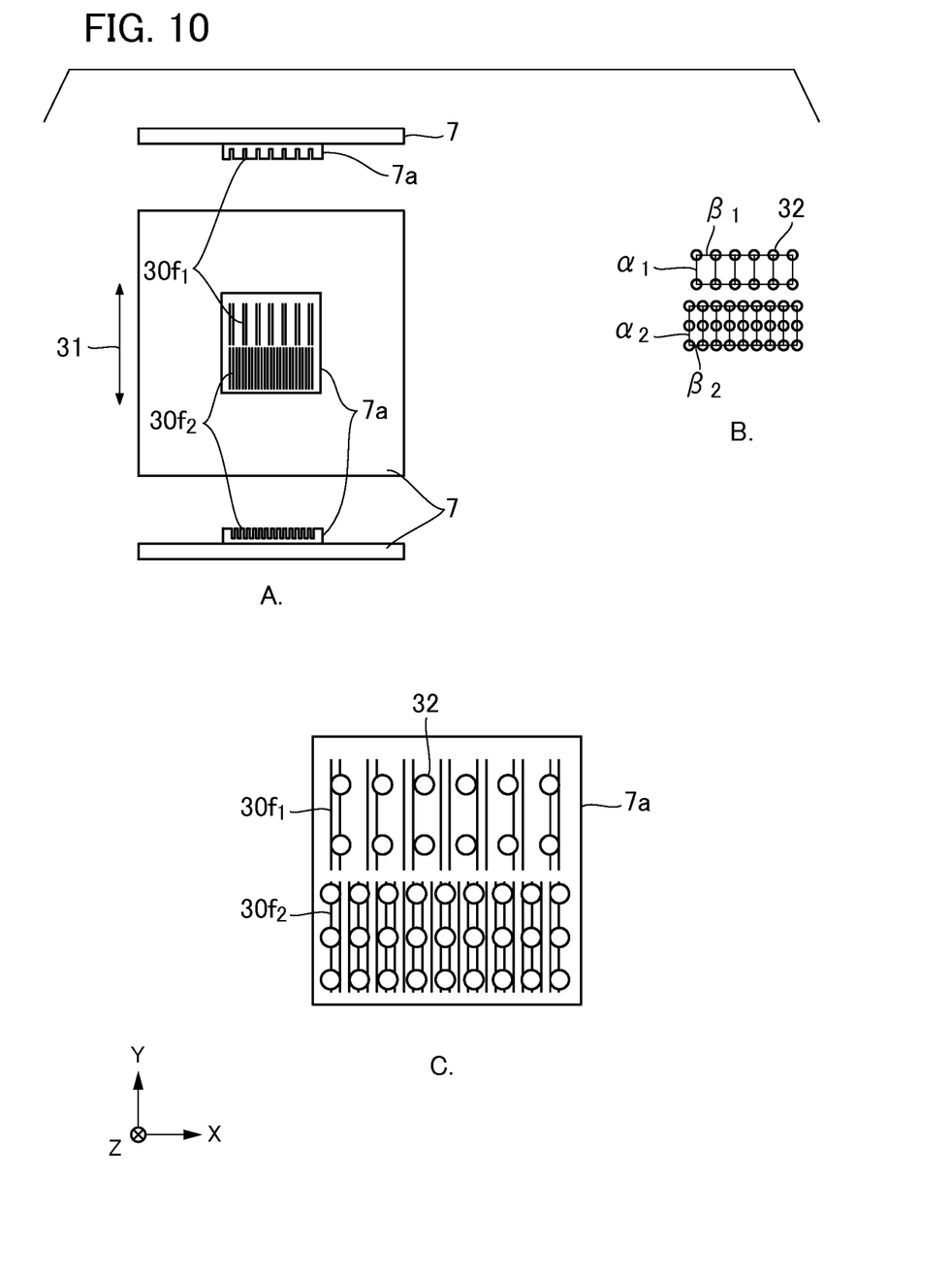
FIG. 10A to 10C are drawings that show the form of a contoured pattern and the disposition of drops in a fourth embodiment.

Next, an imprint apparatus according to a fourth embodiment of the present invention will be explained. The feature of the imprint apparatus of the present embodiment is the point that the disposition of the drops 32 of the resin 9 that are applied to the shot on a wafer 10 is changed from the case of each of the above embodiments when the contoured pattern 30 comprises a plurality of partial areas that have differing pattern densities. FIG. 10A to 10C are schematic plan views that show the form of the contoured pattern 30 present in a plurality of partial areas in the present embodiment that are formed in the pattern portion 7a of the mold 7, and the disposition of drops 32 of resin 9 that are applied to a shot on the wafer 10 with respect to this contoured pattern 30. As shown in FIG. 10A, two contoured patterns 30, that is, the first contoured pattern $30f_1$ and the second contoured pattern $30f_2$, serving as examples, are present in the pattern portion 7a. The pattern size of the first contoured pattern $30f_1$ is more course than the pattern size of the second contoured pattern $30f_2$, and the principal axis directions are both the Y axis direction. Here, as shown in FIG. 10B, in the first contoured pattern $30f_1$, each of the gaps has, as a disposition condition for the drops 32, the relationship $\alpha_1 > \beta_1$, where $\alpha_1$ denotes the gap between drops 32 in the principal axis direction 31 and $\beta_1$ denotes the gap between drops 32 in a direction that is perpendicular to the principal axis direction 31. Similarly, in the second contoured pattern $30f_2$, each of the gaps has the relationship $\alpha_2 > \beta_2$, where $\alpha_2$ denotes the gap between the drops 32 in the principal axis direction 31 and $\beta_2$ denotes the gap between the drops 32 in a direction that is perpendicular to the principal axis direction 31.

Furthermore, in the case in which a plurality of contoured patterns 30 are present on the pattern portion 7a, when the drops 32 spread over the entire surface of the pattern portion 7a during pressing, attention must be paid to making the remaining film thickness of the resin 9 uniform. For example, when the application density of the drops 32 with respect to a plurality of contoured patterns 30 having different pattern densities is made the same, the possibility that unevenness will occur in the remaining film thickness becomes high. Thus, in the present embodiment, the controller 6 makes the application densities of the drops 32 on each contoured pattern 30 different in advance. In addition, at the plurality of contoured patterns 30 having respectively differing pattern densities, because the spreading rate of the drops 32 differs in the principal axis direction 31 and the direction that has perpendicular to thereto, the controller 6 suitably adjusts each of the gaps $\alpha_1$, $\alpha_2$, $\beta_1$, and $\beta_2$ in advance. Specifically, as shown in FIG. 10C, in the first contoured pattern $30f_1$ and the second contoured pattern $30f_2$, it is not always the case that $\alpha_1 = \alpha_2$ and $\beta_1 = \beta_2$. In this manner, according to the present embodiment, even in the case in which the contoured patterns 30 consist of a plurality of contoured patterns having differing pattern densities, an effect that is identical to that of the first embodiment is exhibited. Note that in the boundary region between the first contoured pattern $30f_1$ and the second contoured pattern $30f_2$, in order to prevent a situation in which a uniform remaining film thicknesses cannot be formed over the entire surface of the pattern portion 7a due to mismatching, a dummy pattern may be placed in a range that does not affect the actual product (that is, the circuit operation).

Note that in each of the above embodiments, an imprint apparatus and an imprint method using photo-curing method was described. Even if the step in which a resin is cured by irradiating light is changed to a step using a heat-curing method in which the resin is cured by heating, the operation and the effect of the present invention are identical. That is, the present invention can also be applied to a heat-curing method.

(Article Manufacturing Method)

A method for manufacturing a device (semiconductor integrated circuit element, liquid crystal display element, or the like) as an article may include a step of forming a pattern onto a substrate (wafer, glass plate, film-like substrate, or the like) using the imprint apparatus described above. Furthermore, the manufacturing method may include a step of etching the substrate on which a pattern has been formed. When other articles such as a patterned medium (storage medium), an optical element, or the like are manufactured, the manufacturing method may include another step of processing the substrate on which a pattern has been formed instead of the etching step. The device manufacturing method of this embodiment has an advantage, as compared with a conventional device manufacturing method, in at least one of performance, quality, productivity and production cost of a device.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-146017 filed on Jul. 12, 2013, which is hereby incorporated by reference herein in its entirety.

What is claimed is:

1. An imprint apparatus, which applies an imprint material to several locations on a substrate, brings the imprint material and a mold into contact, and transfers a contoured pattern formed on the mold to the imprint material, comprising:
   a controller configured to set a principal axis direction according to the contoured pattern of the mold and to determine application positions of the imprint material based on the set principal axis direction such that distances between adjacent imprint material drops in the principal axis direction are larger than distances between adjacent imprint material drops in a direction perpendicular to the principal axis direction; and
   a dispenser configured to apply the imprint material based on the determined application positions,
   wherein the controller determines application positions of the imprint material so that the distance between adjacent imprint material drops in a first partial area is longer than the distance between adjacent imprint material drops in a second partial area with a higher pattern density than the first partial area.

2. The imprint apparatus according to claim 1, wherein the controller is configured to determine the distances between the adjacent imprint material drops in the principal axis direction and the distances between the adjacent imprint material drops in the direction perpendicular to the principal axis direction based on the spreading rate of the imprint material during contact in the principal axis direction and the direction perpendicular to the principal axis direction.

3. The imprint apparatus according to claim 2, wherein, with respect to the distances between the adjacent imprint material drops in the principal axis direction, the ratio of the distances between the adjacent imprint material drops in the direction perpendicular to the principal axis direction is, with respect to the spreading rate in the principal axis direction, an inverse of the ratio of the spreading rate in the direction perpendicular to the principal axis direction.

4. The imprint apparatus according to claim 1, wherein the controller is configured to obtain pattern data for the mold, and to determine the principal axis direction based on the pattern data.

5. The imprint apparatus according to claim 1, wherein the controller is configured to determine the application positions such that the imprint material drops are disposed separated in a polygonal lattice form.

6. The imprint apparatus according to claim 1, wherein, with respect to an arbitrary imprint material drop, a band is present that includes a width of the diameter of the imprint material drop along the principal axis direction, and the controller is configured:
   to determine the distances between the adjacent imprint material drops in the principal axis direction using the imprint material drops that overlap the band and are closest to the imprint material drops as a reference; and
   to determine the distances between the adjacent imprint material drops in the direction perpendicular to the principal axis direction using the imprint material drops that do not overlap the band and are closest to the imprint material as a reference.

7. The imprint apparatus according to claim 1, wherein the controller is configured to set a plurality of partial areas with respect to an area on which the contoured pattern of the mold is transferred, to set a respective principal axis direction for each of a plurality of partial areas, and to determine the application positions based on the respective principal axis direction for each of the plurality of partial areas.

8. An imprint method, which applies an imprint material to several locations on a substrate, brings the imprint material and a mold into contact, and transfers a contoured pattern formed in the mold to the imprint material, comprising:
   setting a principal axis direction according to the contoured pattern of the mold;
   determining application positions of the imprint material based on the set principal axis direction such that distances between adjacent imprint material drops in the principal axis direction are larger than distances between adjacent imprint material drops in a direction perpendicular to the principal axis direction; and
   applying the imprint material based on the determined application positions,
   wherein the application positions of the imprint material are determined so that the distance between adjacent imprint material drops in a first partial area is longer than the distance between adjacent imprint material drops in a second partial area with a higher pattern density than the first partial area.

9. An article manufacturing method comprising:
   forming a pattern of an imprint material on a substrate by using an imprint apparatus; and
   processing the substrate in which the pattern has been formed in the forming,
   wherein the imprint apparatus is an imprint apparatus that applies the imprint material to several locations on the substrate, brings the imprint material and a mold into contact, transfers a contoured pattern formed in the mold to the imprint material and comprises:
   a controller configured to set a principal axis direction according to the contoured pattern of the mold and to determine application positions of the imprint material based on the set principal axis direction such that distances between adjacent imprint material drops in the principal axis direction are larger than distances between adjacent imprint material drops in a direction perpendicular to the principal axis direction; and
   a dispenser configured to apply the imprint material based on the determined application positions,
   wherein the controller determines application positions of the imprint material so that the distance between adjacent imprint material drops in a first partial area is longer than the distance between adjacent imprint material drops in a second partial area with a higher pattern density than the first partial area.

10. An imprint apparatus, which applies an imprint material to several locations on a substrate, brings the imprint material and a mold into contact, and transfers a contoured pattern formed on the mold to the imprint material, comprising:
    a controller configured to determine application positions of the imprint material based on a principal axis direction according to the contoured pattern of the mold, such that distances between adjacent imprint material drops in the principal axis direction are larger than distances between adjacent imprint material drops in a direction perpendicular to the principal axis direction; and
    a dispenser configured to apply the imprint material based on the determined application positions,
    wherein the controller determines application positions of the imprint material so that the distance between adjacent imprint material drops in a first partial area is longer than the distance between adjacent imprint material drops in a second partial area with a higher pattern density than the first partial area.

11. The imprint apparatus according to claim 1, wherein a number of patterns per unit area in the second partial area is larger than a number of patterns per unit area in the first partial area.

12. The imprint apparatus according to claim 10, wherein a number of patterns per unit area in the second partial area is larger than a number of patterns per unit area in the first partial area.

* * * * *